United States Patent [19]

Fujii et al.

[11] Patent Number: 4,897,658
[45] Date of Patent: Jan. 30, 1990

[54] ANALOG-TO-DIGITAL CONVERTER OF SUCCESSIVE-APPROXIMATION TYPE

[75] Inventors: Hiroshi Fujii, Kariya; Kenji Kanemaru, Toyota; Yoshinori Fujihashi, Motosu; Nobuyoshi Morita, Kariya, all of Japan

[73] Assignee: Nippondenso Co., Ltd., Kariya, Japan

[21] Appl. No.: 170,358

[22] Filed: Mar. 18, 1988

[30] Foreign Application Priority Data

Apr. 9, 1987 [JP] Japan ................................ 62-87860

[51] Int. Cl.$^4$ ............................................. H03M 1/38
[52] U.S. Cl. ..................................... 341/161; 341/155
[58] Field of Search ............... 341/155, 156, 162, 136, 341/172, 110, 122, 161

[56] References Cited

FOREIGN PATENT DOCUMENTS 59-54326 8/1984 Japan .
60-29034 2/1985 Japan .
61-98022 5/1986 Japan .

OTHER PUBLICATIONS

Kanemaru et al, "11 Bit Successive Approximation CMOS A/D Convertor", Mar. 26, 1987, p. 367 and front cover of National Convention Record, 1987, The Institute of Electronics, Information and Communication Engineers.
Kuboki et al., "Nonlinearity Analysis and Evaluation of Resistor String A/D Converters", a thesis of National Convention Record edited by the Institute of Electronics, Information and Communication Engineers in Japan, 884/12, vol. J67-CNo. 12, pp. 941–948.

Primary Examiner—William M. Shoop, Jr.
Assistant Examiner—Helen Kim
Attorney, Agent, or Firm—Cushman, Darby & Cushman

[57] ABSTRACT

An analog-to-digital converter of the successive-approximation type has a successive-approximation logic circuit for successively generating selection signals defined by significant bits in a digital value, a string of high resistance elements to provide voltage dividers for successively dividing a reference voltage into divided voltages, a switch matrix circuit for generating the divided voltages when activated in response to the selection signals, a comparator for successively comparing an analog level with the divided voltages and for generating comparison signals respectively indicative of the significant bits and an output circuit for generating an output digital signal defined by the significant bits when applied with all the comparison signals, the output circuit being associated with the logic circuit for causing it to generate the selection signals in response to the comparison signals. A string of low resistance elements are provided to apply therethrough the reference voltage to at least one of the voltage dividers during a short period of time immediately after the one of the voltage dividers has been activated.

14 Claims, 6 Drawing Sheets

ANALOG-TO-DIGITAL CONVERTER OF SUCCESSIVE-APPROXIMATION TYPE

BACKGROUND OF THE INVENTION

1. Field of the invention

The present invention relates to an analog-to-digital converter, and more particularly to an improvement in an analog-to-digital converter of the successive-approximation type having a string of resistors as a voltage divider.

2. Description of the Background

Prior analog-to-digital converters of the successive-approximation type successively compare an analog input voltage with a divided voltage from a string resistor circuit, and thereby convert the analog input voltage into a digital form. However, it is recognized that a high resolving power of the analog-to-digital converter causes a great increase in the number and resistance values of the resistors of the string resistor circuit, and further causes an increase in the length of a settling time necessary for analog-to-digital conversion. This results in a lowering of the speed of the analog-to-digital converter of this type. Furthermore, it is, in general, known that the string resistor circuit is fabricated by a plurality of diffusional or polysilicone resistors in the form of a semiconductor integrated circuit. This causes an increase in a resistance value of each of the resistors.

SUMMARY OF THE INVENTION

It is, therefore, a primary object of the present invention to provide an analog-to-digital converter of the successive-approximation type in which an additional string of low resistance elements are effectively utilized to enhance speed in the rise time of a divided voltage from a string of high resistance elements up to an optimum level, thereby to precisely ensure analog-to-digital conversion at a high resolving power and high speed. A method for doing so is also contemplated.

According to the present invention, the primary object is accomplished by providing an analog-to-digital converter of the successive-approximation type for converting an analog level into a digital value. The analog-to-digital converter comprises;

A source of reference voltage for generating a reference voltage;

successive-approximation logic circuit means for successively generating selection signals defined by a plurality of significant bits in the digital value;

a string of high resistance elements connected to the source of reference voltage to provide a series of voltage dividers for successively dividing the reference voltage into a series of divided voltages;

switch matrix circuit means coupled with the high resistance elements for generating the divided voltages therefrom when activated in response to the selection signals from the logic circuit means;

a comparison means for successively comparing the analog level with the divided voltages applied thereto from the switch matrix circuit means and for generating a series of comparison signals respectively indicative of the significant bits in the digital value; and output means coupled with the comparison means for generating an output digital signal defined by the significant bits when applied with all the comparison signals from the comparison means, the output means being associated with the logic circuit means for causing it to generate the selection signals in response to the comparison signals from the comparison means;

wherein a string of low resistance elements are connected to the source of reference voltage to apply therethrough the reference voltage to at least one of the voltage dividers during a short period of time immediately after the one of the voltage dividers has been activated.

BRIEF DESCRIPTION OF THE DRAWINGS

Other objects, features and advantages of the present invention will become more apparent from the following detailed description of preferred embodiments and certain modifications thereof when taken together with the accompanying drawings, in which.

DETAILED DESCRIPTION OF THE PREFERRED EMBODIMENT

Figure 1:
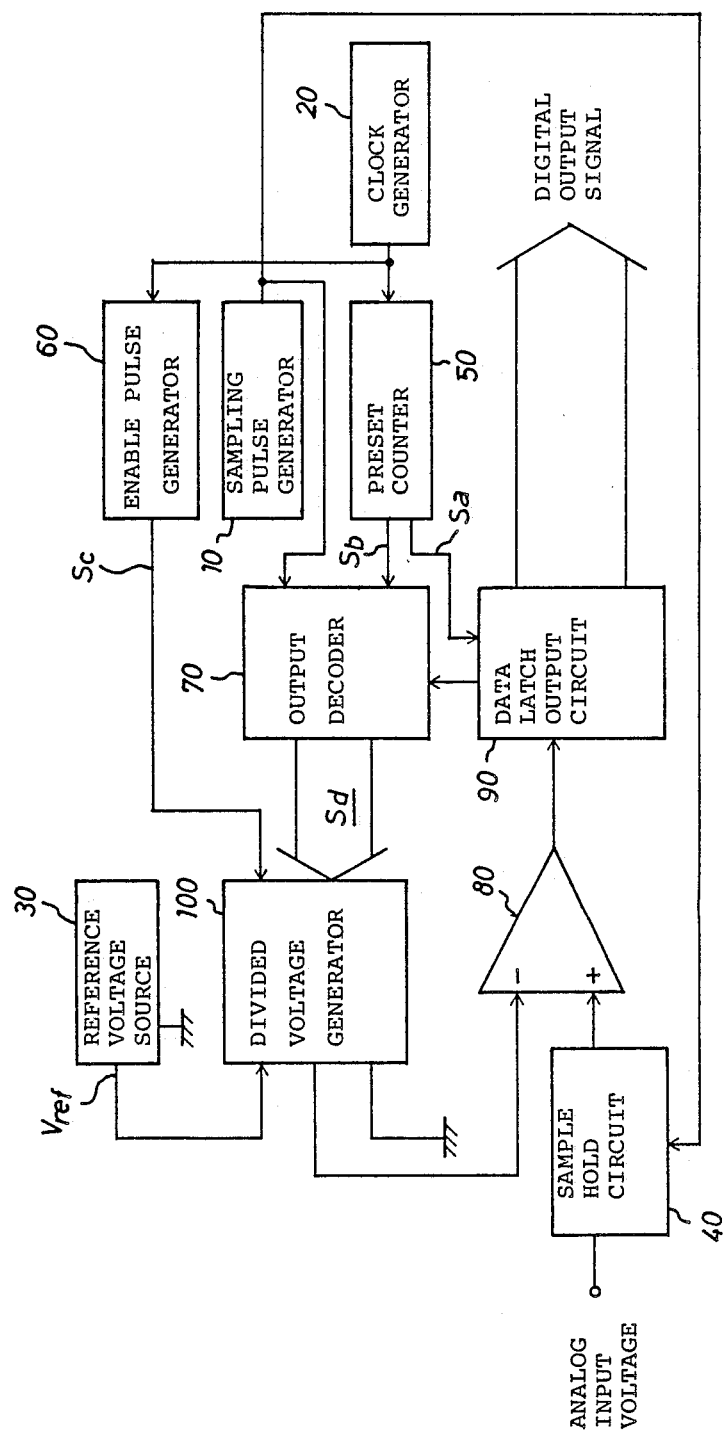
FIG. 1 is a block diagram of an analog-to-digital converter in accordance with the present invention.
Figure 3:
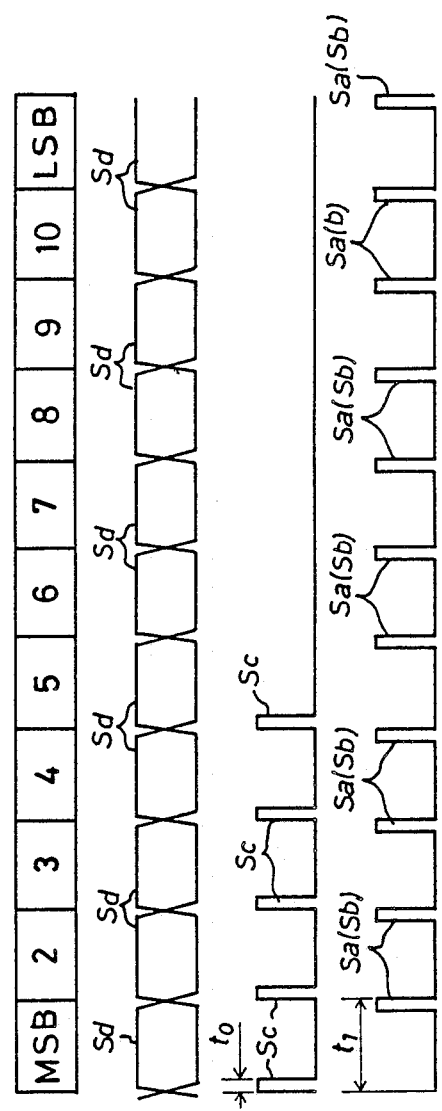
FIG. 3 illustrates waveforms obtained at various points in the divided voltage generator.

FIG. 1 shows an eleven-bit string resistor analog-to-digital or A-D converter of the successive-approximation type in accordance with the present invention. The A-D converter comprises a sampling pulse generator 10 which repetitively produces a sampling pulse with a predetermined time period $t_1$ when the A-D converter is at steady-state operation. In this case, the predetermined time period $t_1$ indicates a settling time which corresponds to time necessary for a rise of a divided voltage from a divided voltage generator 100 up to an optimum level, as described below. A clock generator 20 produces a clock pulse with a predetermined frequency in sequence. A reference voltage source 30 generates a positive reference voltage $V_{ref}$ (for instance 5(V)). A sample hold circuit 40 takes an analog input voltage in response to a sampling pulse from sampling pulse generator 10 and holds the taken analog input voltages as a sample hold voltage. A preset counter 50 repetitively counts clock pulses from clock generator 20 up to a predetermined preset value, which corresponds to the time $t_1$ and generates latch and selection signals Sa and Sb respectively with the predetermined time period $t_1$ (see FIG. 3). In this case, timing in generation of the latch signal Sa is determined slightly prior to that in generation of the selection signal Sb. The predetermined preset value corresponds to the settling time as mentioned above.

An enable pulse generator 60 is responsive to the start of operation of the A-D converter to produce an enable pulse Sc (see FIG. 3) with a predetermined pulse width corresponding to a predetermined short time period $t_0$. Then, the pulse generator 60 starts to count the clock pulses from clock generator 20 and generates an enable pulse Sc repetitively upon the count reaching a predetermined number corresponding to the predetermined time period $t_1$. The pulse generator 60 stops the generation of the enable pulse Sc after the counted number reaches a number corresponding to $5t_1$. Thereafter, the pulse generator 60 repeats generation and s top of an enable pulse Sc, as described above, at each time when the counted number of clock pulses reaches to a number corresponding to $11t_1$. In the embodiment, the above-mentioned short time period $t_0$ indicates the time necessary for rise of a divided voltage from divided voltage generator 100 up to a level close to the optimum level as described above.

Upon initial receipt of a sampling pulse from sampling pulse generator 10, an output decoder 70 generates an eleven-bit decode 70 is responsive to a selection signal Sb from preset counter 50 and a sampling pulse from generator 10 to decode a latch comparison signal from a data latch output circuit 90, as described below, so as to generate an eleven-bit decode signal Sd indicative of the decoded contents. The decoding operation of output decoder 70 is performed repetitively in response to selection signals from preset counter 50 and sampling pulses from sampling pulse generator 10. In this case, the eleven decode signals Sd define respectively eleven bits of most to least significant bits in a value of a digital signal corresponding to an analog input voltage. In other words, a series of the decode signals Sd define divided voltages appearing from voltage divider 100 and corresponding to the most to least significant bits respectively. A comparator 80 compares a sample hold voltage from sample hold circuit 40 with a divided voltage from divided voltage generator 100 to generate a comparison signal. This comparing operation of comparator 80 is performed each time the sample hold circuit 40 is responsive to a sampling pulse from generator 10 to produce a sample hold voltage. This means that the comparing operation of comparator 80 is performed upon each lapse of the settling time. A data latch output circuit 90 is responsive to a latch signal Sa from preset counter 50 to latch a comparison signal from comparator 80 so as to generate the same signal as a latch comparison signal. When the number of the latch comparison signals from comparator 80 increases up to eleven, the data latch output circuit 90 produces an eleven-bit digital output signal corresponding to an analog input voltage.

Figure 2:
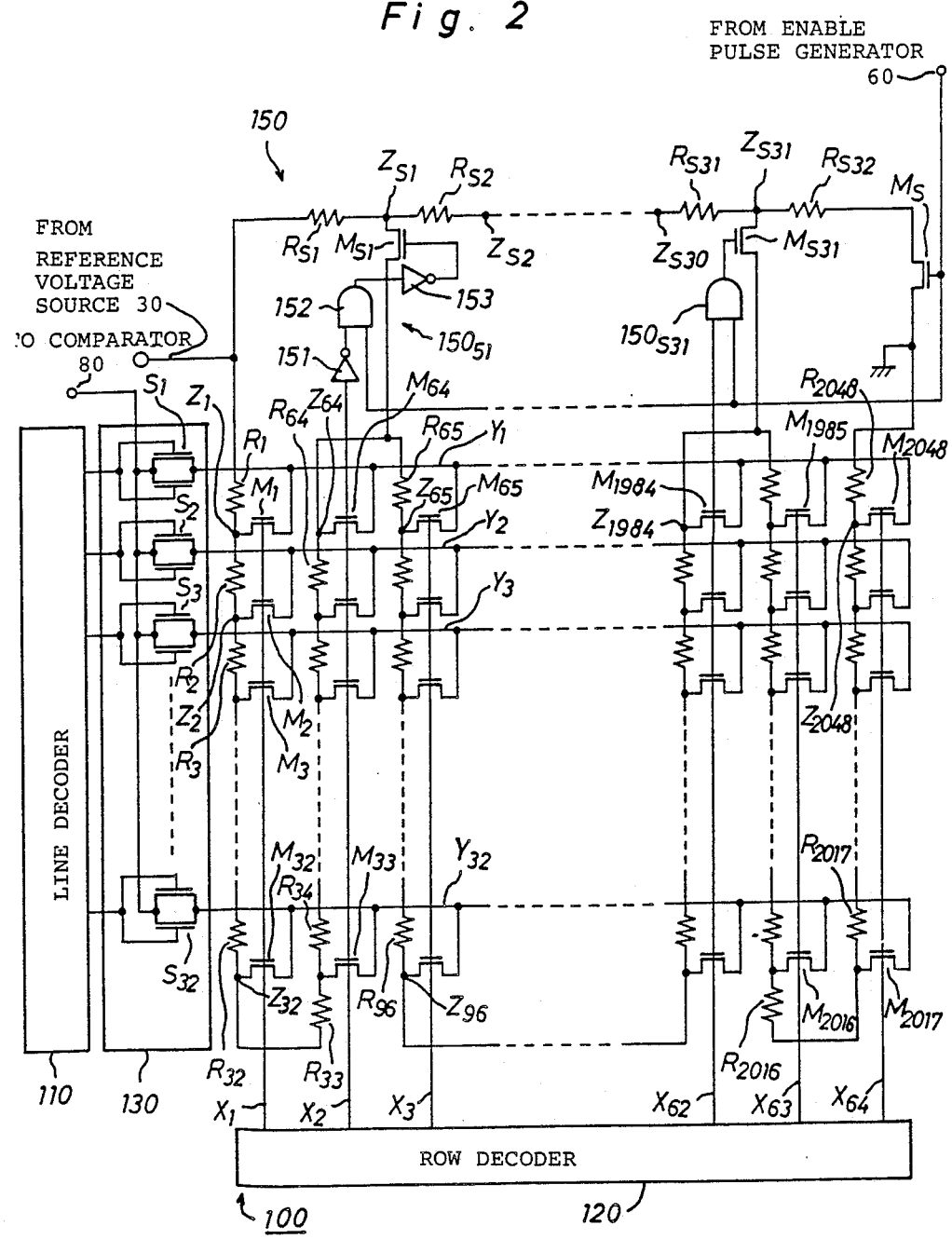
FIG. 2 is a detailed circuit diagram of the divided voltage generator shown in block form in FIG. 1.

As shown in FIGS. 1 and 2, the divided voltage generator 100 comprises a line decoder 110 and a row decoder 120 which are connected to output decoder 70. The line decoder 110 is responsive to a decode signal Sd from output decoder 70 to decode the five lowest bits of a value of the decode signal Sd so as to generate a 32-bit decode signal indicative of the decoded contents at its 32 output terminals. This means that on a basis of the decoded contents as described above, one of the 32 output terminals of line decoder 110 is activated and the remaining output terminals of line decoder 110 are maintained deactivated respectively. In this case, one output terminal of line decoder 110 shown at the uppermost position in FIG. 2 corresponds to the highest-order position, whereas one terminal of line decoder 110 shown at the lowermost position in FIG. 2 corresponds to the lowest-order position. The row decoder 120 is responsive to a decode signal Sd from output decoder 70 to decode the high-order six bits of the value of the decode signal Sd so as to generate a 64-bit decode signal indicative of the decoded contents at its 64 output terminals. This means that on the basis of the decoded contents as described above, one of the 64 output terminals of row decoder 120 is activated, and the remaining output terminals of row decoder 120 are maintained deactivated respectively. In this case, one output terminal of row decoder 120 shown at the extreme left position in FIG. 2 corresponds to the highest-order position, whereas one output terminal of row decoder 120 shown at the extreme right position corresponds to the lowest-order position.

A complementary semiconductor switch circuit 130 comprises 32 semiconductor switches $S_1$–$S_{32}$. Each switch is formed of a pair of field effect transistors of the metal-oxide-semiconductor type or MOSFETs connected with each other in the form of the complementary type. Each of the semiconductor switches $S_1$–$S_{32}$ has a pair of gates, both of which are connected to the output terminals of line decoder 110, drains which are connected to main string resistor circuit 140, and sources which are commonly connected together, and to comparator 80. The semiconductor switch $S_1$, $S_2$, . . ., or $S_{32}$ is made conductive in response to activation of an associated output terminal of line decoder 110 corresponding to and connected to the pair of gates of the switch $S_m$ indicates one of switches $S_1$–$S_{32}$. Upon being made conductive, the semiconductor switch $S_m$, which receives at its pair of drains a divided voltage from a main string resistor circuit 140, applies the divided voltage through its pair of sources and to the investing input of comparator 80.

As shown in FIG. 2, the main string resistor circuit 140 comprises a string of $64\times32$ resistors $R_1$–$R_{2048}$ which have a high resistance value respectively and are connected in series with each other. The resistors $R_1$–$R_{2048}$ are divided into 64 groups, each of which is composed of 32 resistors $R_m$ and alternately arranged in parallel with each of 64 row lead wires $X_1$–$X_{64}$. An array of $64\times32$ MOSFETs $M_1$–$M_{2048}$ are arranged respectively to correspond with the resistors $R_1$–$R_{2048}$. The MOSFETs $M_1$–$M_{2048}$ each function as semiconductor switch elements respectively and are divided into 64 groups, each of which is composed of 32 MOSFETs $M_m$–$M_m$. In this case, the reference character $M_m$ indicates one of MOSFETs $M_1$–$M_{2048}$. The MOSFETs $M_m$–$M_m$ of each one group have their gates commonly connected to one of row lead wires $X_1$–$X_{64}$ sources of the MOSFETs $M_m$–$M_m$ of each group are connected respectively to common terminals $Z_1$–$Z_{2048}$ between respective pairs of resistors $R_m$–$R_m$ connected in series to each other. The drains of one MOSFET from each group, in a same line position, are commonly connected to one lead wire connected to a drain of one of the semiconductor switches $S_m$. Drains of MOSFETs $M_1$–$M_{32}$ are connected to line lead wires $Y_1$–$Y_{32}$ respectively, drains of MOSFETs $M_{33}$–$M_{64}$ are connected to line lead wires $Y_{32}$–$Y_1$ respectively, drains of MOSFETs $M_{64}$–$M_{96}$ are connected to line lead wire $Y_1$–$Y_{32}$ respectively, . . ., and drains of MOSFETs $M_{2048}$ are connected to line lead wires $Y_1$–$Y_{32}$. In this embodiment, the resistor $R_1$, at one end of the series string of resistors, is connected to the reference voltage source 30, and the resistor $R_{2048}$ at the other end of the series string of resistors, is grounded. The line lead wires $Y_1$–$Y_{32}$ are connected respectively to the commonly connected sources of semiconductor switch elements $S_1$–$S_{32}$ of semiconductor switch circuit 30, and the row lead wires $X_1$–$X_{32}$ of semiconductor switch circuit 30, and the row lead wires $X_1$–$X_{64}$ are connected respectively to the output terminals cf row decoder 120.

In operation of the main string resistor circuit 140, the resistors $R_1$–$R_{2048}$ divide the reference voltage $V_{ref}$ from reference voltage source 30 during non-conduction of any of MOSFETs $M_1$–$M_{2048}$ into divided voltages and generate the divided voltages respectively at the common terminals $Z_1$–$Z_{2048}$. When one of the output terminals of the row decoder 120 is activated, the corresponding row lead wire $X_n$ makes conductive 32 MOSFETs $M_m$–$M_m$ connected thereto. When one of the switch elements $S_1$–$S_{32}$ of semiconductor switch circuit 130 is made conductive, the corresponding line lead wire $Y_m$ receives the divided voltage from the source of the conducting MOSFETs $M_m$ connected thereto and applies the same divided voltage through the conducting one of switch elements $S_1$–$S_{32}$ to the inverting input of comparator 80. This means that the comparator 80 receives a divided voltage appearing at the common terminal $Z_m$, which terminal is defined by the decoded results of line decoder 110 corresponding to the five low-order bits of a value of a decode signal from output decoder 70 and by the decoded result of row decoder 120 corresponding to the six high-order bits of the value of the decode signal from output decoder 70.

As shown in FIGS. 1 and 2, a subsidiary string resistor circuit 150 is connected to the reference voltage source 30, the enable pulse generator 60 and the main string resistor circuit 140. The subsidiary string resistor circuit 150 comprises a semiconductor switch element in the form of a MOSFETs Ms which is connected at its gate to the output terminal of enable pulse generator 60. A drain of MOSFET Ms is grounded and a source of MOSFET Ms is connected to the output terminal of reference voltage source 30 through a string of 32 resistors $R_{s32}$–$R_{s1}$. Then, the MOSFET Ms is made conductive in response to a enable from pulse generator 60.

The resistors $R_{s1}$–$R_{s32}$ have a low resistance value respectively and are connected in series to each other. The resistor string $R_{s1}$–$R_{s32}$ receive the reference voltage $V_{ref}$ from reference voltage source 30 at one end at resistor $R_{s1}$ in response to conduction of MOSFET Ms, and divides $V_{ref}$ so as to generate divided voltages respectively at common terminals $Z_{s1}$, $Z_{s2}$ . . ., $-Z_{s31}$ between respective pairs of resistors $R_{s1}$, $R_{s2}$, $R_{s3}$, . . ., $R_{s31}$, $R_{s32}$. 31 MOSFETs $M_{s1}$–$M_{s31}$ are provided as a semiconductor switch elements respectively. Sources of MOSFETs $M_{s1}$–$M_{s31}$ are connected respectively to the common terminals $Z_{s1}$–$Z_{s31}$ of resistors $R_{s1}$–$R_{s32}$, whereas drains of MOSFETs $M_{s1}$–$M_{31}$ are connected respectively to the common terminals $Z_{64}$, $Z_{128}$, $Z_{192}$ . . ., $Z_{1984}$ of the main string resistor circuit 140. In this case, each suffix of the reference characters $Z_{128}$, $Z_{192}$ . . ., $Z_{1984}$ corresponds to integer times as large as 64. Furthermore, a total of the resistance values of resistors $R_{s1}$–$R_{32}$ is smaller than a total of the resistance values of resistors $R_1$–$R_{2048}$.

As shown in FIG. 2, 31 logic circuits $150_{s1}$–$150_{s31}$ (FIG. 2 indicates only the logic circuits $150_{s1}$, $150_{s31}$) are provided in the subsidiary string resistor circuit 150. The logic circuit 150 comprises an inverter 151 which is connected at its input terminal to the row lead wire $X_2$ of the main string resistor circuit 140 to generate an inverter signal with a high level or low level when the row decoder 120 is activated or deactivated at its output terminal connected to the row lead line $X_2$. AND-gate 152 has one input terminal connected to the output terminal of the inverter 151 and the other to enable pulse generator 60 to generate a gate signal with a high level in response to the enable pulse from enable pulse generator 60 and the inverter signal with high level from inverter 151. The gate signal from AND-gate 152 disappears in response to at least one of the enable pulses from enable pulse generator 60 and the inverter with a low level from inverter 151.

The inverter 153 is responsive to the gate signal from AND-gate 152 to generate an inverted signal with a low level. The inverter signal from inverter 153 rises to a high level in response to the disappearance of the gate signal from AND-gate 152. This means that MOSFET $M_{s1}$ is made conductive or non-conductive in response to the inverter signal with low level or high level from inverter 153. The logic circuits $150_{s2}$–$150_{s30}$ have respectively the same construction as that of the logic circuit $150_{s1}$. The logic circuit $150_{s2}$ is connected among a gate of MOSFET $M_{s2}$, the row lead wire $X_4$ and the output terminal of enable pulse generator 60, the logic circuit $150_{s3}$ is connected among a gate of MOSFET $M_{s3}$, the row lead wire $X_6$ and the output terminal of the enable pulse generator 60, . . ., and the logic circuit $150_{s30}$ is connected among a gate of MOSFET $M_{s30}$, the row lead wire $X_{60}$ and the output terminal of enable pulse generator 60. In this case, each suffix of the reference characters $X_4$, $X_6$, . . ., $X_{30}$ corresponds to integer times as large as 2. Thus, the logic circuits $150_{s2}$–$150_{s30}$ have respectively the substantially same function as that of the logic circuit $150_{s1}$. This means that the logic circuits $150_{s2}$–$150_{s30}$ make respectively MOSFETs $M_{s30}$ selectively conductive in relation to activation of the row lead wires $X_4$–$X_{60}$ and an enable pulse from enable pulse generator 60.

The logic circuit $150_{s31}$ is an AND-gate which is connected at its output terminal to a gate of MOSFET $M_{s31}$ and connected at its input terminals to the row lead wire $X_{62}$ and the output terminal of enable pulse generator 60. Then, the logic circuit $150_{s31}$ generates a gate signal with high level in response to an enable pulse from enable pulse generator 60 when the row lead wire $X_{62}$ is deactivated by row decoder 120. The gate signal from logic circuit $150_{s31}$ disappears when the row lead wire $X_{62}$ is activated or when the enable pulse from enable pulse generator 60 disappears. This means that MOSFET $M_{s31}$ is made selectively conductive in response to the gate signal from logic circuit $150_{s31}$. In the embodiment, the subsidiary string resistor circuit 150 is formed by a semiconductor integrated circuit together with the main string resistor circuit 140.

In operation of the A-D converter, the sampling pulse generator 10 sequentially produces a sampling pulse with the predetermined period of time $t_1$, the clock generator 20 generates a clock pulse in sequence, the reference voltage source 30 produces a reference voltage $V_{ref}$, the preset counter 50 generates latch and selections signals Sa and Sb with the time period $t_1$ sequentially in accordance with the number of clock pulses from clock generator 20, and the enable pulse generator 60 generates an enable pulse Sc with the time period t in sequence in accordance with the number of clock pulses from clock generator 20.

When the sampling pulse first appears from the sampling pulse generator 10 during this state, the sample hold circuit 40 takes an analog input voltage to hold the taken analog input voltage as a sample hold voltage, and the output decoder 70 generates a first decode signal Sd in response to the first sampling pulse from sampling pulse generator 10. In this example, a value of the decode signal Sd corresponds to (10000000000), that is it defines a most significant bit or MSB (see FIGS. 3, 4) of the value of the digital output signal from data latch output circuit 90.

The line decoder 110 of divided voltage generator 100 is responsive to the decode signal Sd from output decoder 70 to decode the lowest order five bits (and which are 00000 at this time) of the decode signal Sd, and which produces a decode signal indicative of the decoded contents. Semiconductor switch circuit 130 is responsive to the decode signal from line decoder 110 to make conductive one of switch elements $S_1$–$S_{32}$ which therefore maintains it at an activated condition which here is a high level the line lead wire $Y_m$ connected thereto. In this case, the reference character $Y_m$ indicates one of the line lead wires $Y_1$–$Y_{32}$. The row decoder 120 decodes the six highest order bits (100000) of the decode signal Sd to generate a decode signal indicative of the decoded contents in response to which one of the row lead wires $X_1$–$X_{64}$ is selected, to make conductive a group of MOSFETs $M_m$–$M_m$ connected thereto. In this instance, assuming that decode signal Sd is 100 . . . 00, the above-mentioned selections of the one line lead wire $Y_m$ and the one row lead wire $X_n$ (or open of lead wires $X_1$–$X_{64}$) provide a half ($V_{ref}/2$) of the reference voltage as the divided voltage which is issued from the semiconductor which circuit 130 to comparator 80.

When an enable pulse Sc first appears from the enable pulse generator 60, MOSFET Ms as subsidiary string resistor circuit 150 is rendered conductive to ground the resistor $R_{s32}$. After one of the row lead wires $X_1$–$X_{64}$ is selected as previously described, the logic circuit of subsidiary resistor string circuit 150 connected to the selected one of the line lead wires $X_1$–$X_{64}$ is responsive to the first enable pulse Sc from enable pulse generator 60 to make conductive the MOSFET connected thereto. In other words, such a conducting MOSFET of the subsidiary string resistor circuit 150 shorts the common terminals of the main and subsidiary string resistor circuits 140, 150 respectively connected thereto.

When the respective ones $Y_m$, $Y_n$ of the line and row lead wires of main string resistor circuit 140 are selected and the respective one common terminals of the main and subsidiary string resistor circuits 140 and 10 are shorted, an electric current corresponding to the reference voltage $V_{ref}$ from reference voltage source 30 flows MOSFET Ms via the resistor $R_{s1}$–$R_{s32}$ in accordance with the first and second time constants without flowing into the resistors of the main string resistor circuit 140. Since the resistance of resistors $R_{s1}$–$R_{s32}$ are less than $R_1$–$R_{2048}$, the first time constant, which is defined by the resistors $R_{s1}$–$R_{s32}$ and a floating capacity of various electric elements arranged near the resistors $R_{s1}$–$R_{s32}$, is determined to be considerably smaller than the second time constant defined by the resistor $R_1$–$R_{2048}$ and a floating capacity of various electric elements arranged near the resistors $R_1$–$R_{2048}$. Thus, an electric potential appearing at the common terminals which are shorted as described above rapidly rises, as shown by the reference character $L_1$ in FIG. 4, owing to flowing of the electric current into the resistors $R_{s1}$–$R_{s32}$.

When the first enable pulse from enable pulse generator 60 drops after its duration to a low level, MOSFET Ms of the subsidiary string resistor circuit 150 is made non-conductive, and simultaneously the common terminals, which are shorted as described above are disconnected from each other by non-conduction of the MOSFET connected therebetween. Then, the electric current corresponding to the reference voltage $V_{ref}$ from reference voltage generator 30 flows into the resistors of main string resistor circuit 140. As a result, the electric potential appearing at the common terminal which is disconnected as described above in the main string resistor circuit 140 rises slowly with the second time constant, as shown by the reference character L2 in FIG. 4, and precisely reaches a half ($V_{ref}/2$) of the reference voltage in a stable manner. Therefore, the semiconductor switch circuit 130 applies to the comparator 80 a divided voltage from main string resistor circuit 140 which has been rapidly risen up to ($V_{ref}/2$) in a stable manner. From this description, it will be understood that the subsidiary string resistor circuit 150 causes the divided voltage to rise rapidly from switch circuit 130 nearly up to ($V_{ref}/2$) during the predetermined time period $t_0$, and that thereafter the main string resistor circuit 140 rises slowly the divided voltage up to ($V_{ref}/2$). Thus, even though resolving power of main string resistor circuit 140 is high, the divided voltage may be quickly raised to ($V_{ref}/2$) in precision with the predetermined time period $t_1$ of settling time. Furthermore, unnecessary electric power consumption may be restrained because of effective operation of the subsidiary string register circuit 150 only within the predetermined short period of time $t_0$.

Upon receiving the divided voltage from switch circuit 130, as previously described, the comparator 80 compares the divided voltage with a sample hold voltage from sample hold circuit 40 to generate a comparison signal. The first latch and selection signals Sa and Sb are produced by preset counter 50, and the data latch output circuit 90 is responsive to the latch signal Sa to latch the comparison signal from comparator 80 so as to produce a latched comparison signal. The output decoder 70 is responsive to the first selection signal Sb to receive the latched comparison signal from data latch output circuit 90 to produce a second decode signal Sd. In this instance, a value of the second decode signal Sd corresponds to a bit next to the MSB (II000 . . . 00) in a value of the digital output signal from data latch output circuit 90. Thereafter, a divided voltage from switch circuit 130 rapidly rises by the main and subsidiary string resistor circuits 140, 150, as shown by the reference characters $L_3$, $L_4$ in FIG. 4, precisely up to reach (3 $V_{ref}/4$). This effect operations of the comparator 80, data latch output circuit 90 and output decoder 70 in the same manner as that as previously described.

After this state, the same operation as that as previously described in repeated until the enable pulse generator 60 produces a fifth enable pulse Sc. When successive comparison regarding five bits from the MSB to the fifth bit in high order ends successive comparison regarding the sixth to eleventh bits is performed solely by the main string resistor circuit 140 without any use of the subsidiary string resistor circuit 150. When latched eleven comparison signals from comparator 80 in relation to the MSB to LSB, the data latch output circuit 90 generates a digital output signal defining the latched eleven comparison signals.

As understood from the above description, when one common terminal $Z_m$ of main string resistor circuit 140 corresponding to the MSB is selected, the selected common terminal $Z_m$ and the corresponding one common terminal of the subsidiary string resistor circuit 10 are shorted and maintained at the same electric potential. In this case, the reference character $Z_m$ indicates one of common terminals $Z_1$–$Z_{2048}$. Then, an electric current corresponding to the reference voltage $V_{ref}$ from reference voltage source 30 flows rapidly into the resistors $R_{s1}$ to $R_{s32}$ and MOSFET Ms of subsidiary string resistor circuit 150 during the lapse of the predetermined short period of time to after selection of the one common terminal $Z_m$. When the common terminals which are shorted as described above are disconnected from each other after the lapse of the short period of time $t_0$, the electric current from reference voltage source 30 flows slowly into only the resistors of the main string resistor circuit 140. Thus, the divided voltage appearing at the common terminal $Z_m$ which is selected as mentioned above, is rapidly charged nearly up to ($V_{ref}/2$) by the subsidiary string resistor circuit 140 within ($t_1-t_0$). This means that a comparison signal to be latched by the data latch output circuit 90 after lapse of the predetermined time period $t_1$ may be issued from the comparator 80 when a sample hold voltage from sample hold circuit 40 is compared with the divided voltage which rises precisely up to ($V_{ref}/2$) in a short time and appears from switch circuit 130 in stability.

Figure 4:
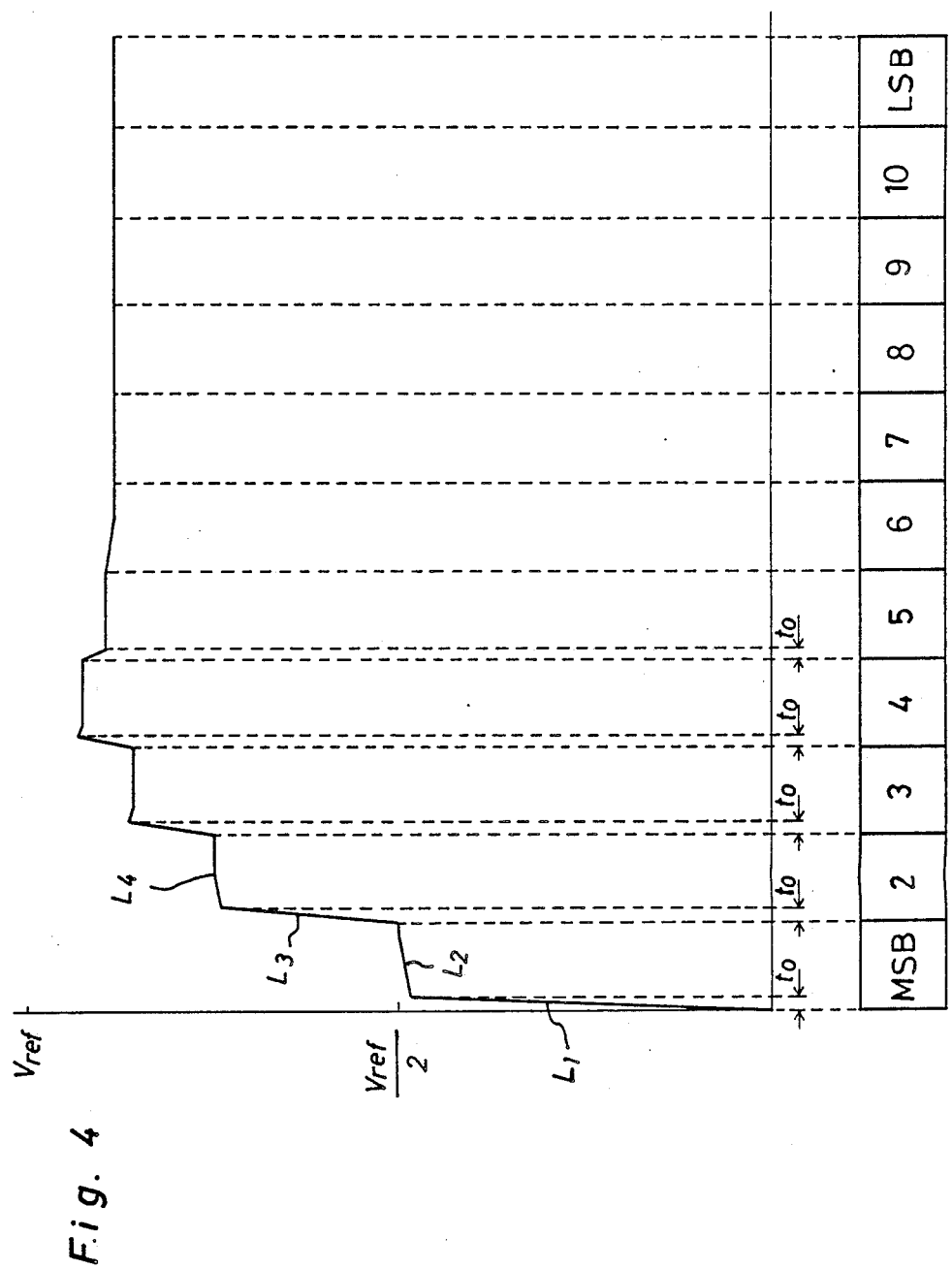
FIG. 4 is a graph for explaining operation of the divided voltage generator.

Regarding the second to fifth MSB's, each divided voltage from switch circuit 130 is charged by the string resistor circuits 150, 140, as previously described, up to each optimum level, precisely in stability with the predetermined period of time $t_1$, in sequence. Thus, each comparison signal to be latched by the data latch output circuit 90 with each period of time t1 is issued by the comparator 80 at each time when each sample hold voltage from sample circuit 40 is successively compared with each divided voltage which is precisely stabilized in each optimum level in a short time. The six low order bits use the recognition that each divided voltage to be issued from switch circuit 130 hardly changes as shown in FIG. 4. For this reasons, each divided voltage may be effected using only by the main string resistor circuit 150. As a result, analog to digital conversion in the A-D converter of this type may be performed precisely in high speed regardless of how high the resolving power thereof, for instance, more than 11 bits.

For the actual practice of the present invention, it is preferable that for precisely effecting A-D conversion, the resistors of the main and subsidiary string resistor circuit 140, 150 are formed with the same resistive material as each other.

Although in the above embodiment the logic circuits $150_{s1}$–$150_{s31}$ of subsidiary string resistor circuit 150 are connected respectively to the row lead lines $X_2$–$X_{62}$ and the enable pulse generator 60, they may be modified to be connected only to the enable pulse generator 60 such that they are activated only in response to the enable pulse from enable pulse generator 60 to make MOSFETs $M_{s1}$–$M_{s32}$ conductive.

For the actual practice of the present invention, the subsidiary string resistor circuit 150 may be also adapted to used in the remaining bits except the five bits in high-order.

Figure 5:
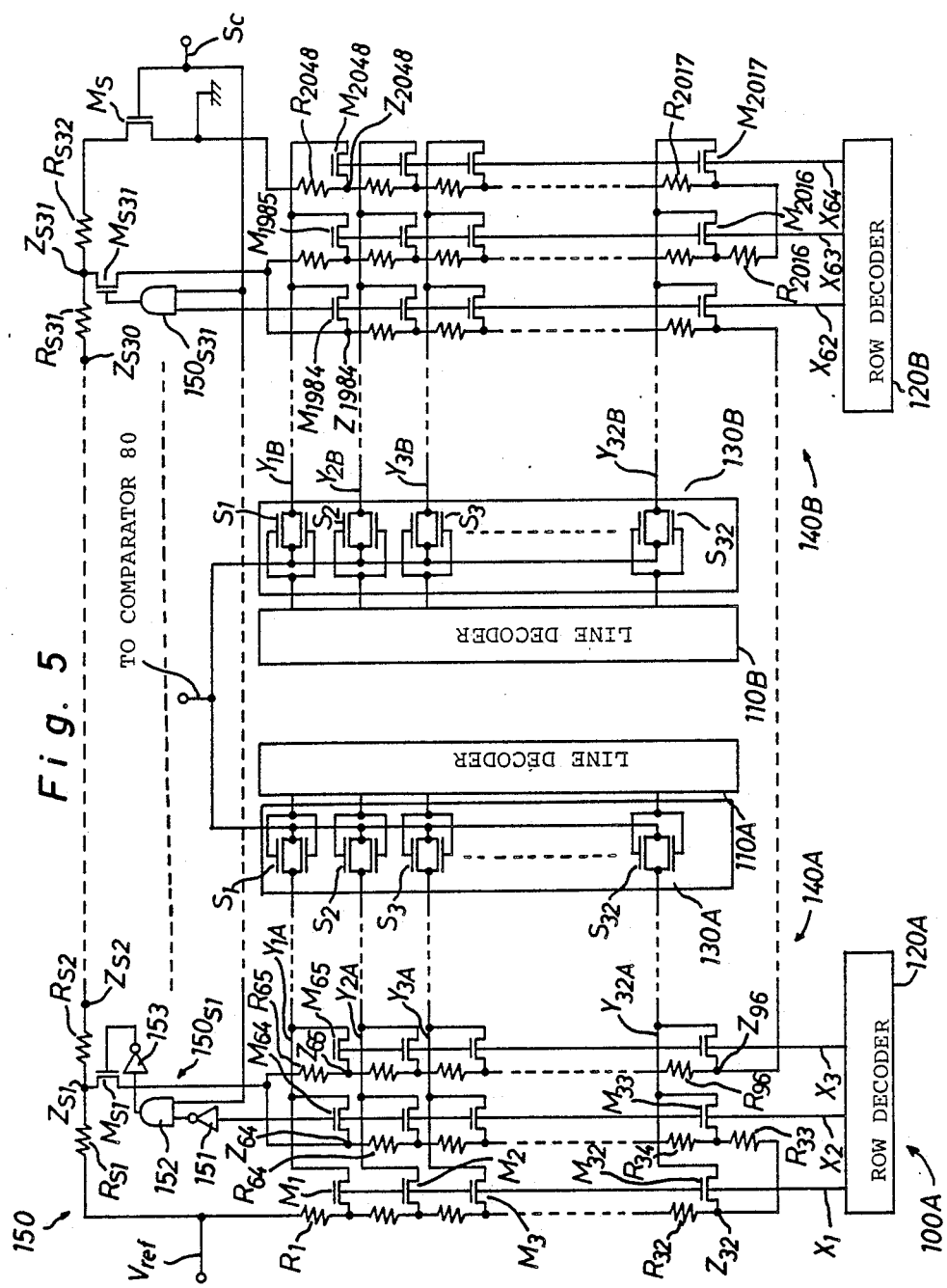
FIG. 5 illustrates a modification of the divided voltage generator.

FIG. 5 illustrates a modification of the previous embodiment in which a divided voltage generator 100A is used in place of the divided voltage generator 100 as previously described. The divide voltage generator 100A comprises a respective pair of line decoders 110A, 110B, row decoders 120A, 120B and semiconductor switch circuits 130A, 130B. Each of the line decoders 110A, 110B has the same construction as that of line decoder 110 as previously described. Thus, each of line decoders 110A, 110B has the same function as that of the line decoder 110 in relation to a decode signal Sd from line decoder 110. Each of the row decoders 120A, 120B has the substantially same construction as that of the row decoder 120 as previously described. In this case, the decoder 120A has 32 output terminals which are connected respectively to the row lead wires $X_1$ to $X_{32}$, whereas the row decoder 120B has 32 output terminals which are connected respectively to the remaining row lead wires $X_{33}$ to $X_{64}$. Then, the row decoder 120A is responsive to a decode signal Sd from output decoder 70 to decode three high order bits of a value of the decode signal Sd so as to generate a 32-bit decode signal indicative of the decoded contents at its 32 output terminals. Meanwhile, the row decoder 120B is responsive to the decode signal Sd to decode three bits next to the above-mentioned three bits in the decode signal Sd so as to generate a 32-bit decode signal indicative of the decoded contents at its 32 output terminals. Each of the semiconductor switch circuits 130A, 130B has the same construction as that of the semiconductor switch circuit 130. The semiconductor switch circuit 130A effects the same function as that of switch circuit 130 in relation to a decode signal from line decoder 110A, whereas the semiconductor switch circuit 130B effects the same function as that of switch circuit 130 in relation to a decode signal from line decoder 110B.

As shown in FIG. 5, a main string resistor circuit 140A is connected to the row decoder 120A, semiconductor switch circuit 130A and subsidiary string resistor circuit 150, whereas a main string resistor circuit 140B is connected to the row decoder 120B, semiconductor switch circuit 130B and subsidiary string resistor circuit 150. Each of the main string resistor circuits 140A, 140B has the substantially same construction as that of the main string resistor circuit 140. In this case, the main string resistor circuit 140A comprises a string of resistor $R_1$–$R_{1024}$, MOSFETs $M_1$–$M_{1024}$ and row lead wires $X_1$–$X_{32}$, as previously described and comprises line lead wires $Y_{1A}$–$Y_{32A}$ corresponding respectively to the line lead wires $Y_1$–$Y_{32}$ as previously described. Meanwhile, the main string resistor circuit 140B comprises a string of resistors $R_{1025}$–$R_{2048}$, MOSFETs $M_{1025}$–$M_{2048}$ and row lead wires $X_{33}$–$X_{64}$, as previously described and comprises line lead wires $Y_{1B}$–$Y_{32B}$ corresponding respectively to the line lead wires $Y_1$–$Y_{32}$, as previously described. The line lead wires $Y_{1A}$–$Y_{32A}$ are connected respectively to drains of semiconductor switches $S_1$–$S_{32}$ of switch circuit 130A, whereas the line lead wires $Y_{1B}$–$Y_{32B}$ are connected respectively to drains of semiconductor switches $S_1$–$S_{32}$ of switch circuit 130B. In addition, a string of the resistors $R_1$–$R_{1024}$ are connected in series with a string of the resistor $R_{1025}$–$R_{2048}$. Each length of the line lead wires $Y_{1A}$–$Y_{32}$ and $Y_{1B}$–$Y_{32B}$ is equal to a half length of each line wire $Y_1$–$Y_{32}$.

In the modification, each of the preset counter 50 and enable pulse generator 60 is arranged for starting count of the number of clock pulses from clock generator 20 upon lapse of a predetermined delay time $t_n$ after start of the A-D converter. The output decoder 70 is arranged to simultaneously generate a decode signal Sd defining MSB and a pair of decode signals Sd, Sd defining the bit next to MSB.

When the A-D converter is conditioned in its operation, the output decoder 70 is responsive to a first sampling pulse from sampling pulse generator 80 to produce first and second decode signals Sd—Sd which are simultaneously applied to the divided voltage generator 100A. At the same time, an electric current corresponding to the reference voltage $V_{ref}$ from reference voltage source 30 flows into the resistors $R_1$–$R_{1024}$ and $R_{1025}$–$R_{2048}$. Upon receiving the first decode signal Sd the line decoder 110A decodes five bits in low-order of a value of the first decode signal Sd to produce a decode signal. Then, the switch circuit 130A is responsive to the decode signal from line decoder 110A to make conductive one of switch elements $S_1$-$S_{32}$ which activates one of the line lead wires $Y_{1A}$-$Y_{32A}$.

Upon receiving the first decode signal Sd, the row decoder 120A decodes three bits in high-order of a value of the first decode signal Sd to generate a decode signal. Then, one of the row lead wires $X_1$-$X_{32}$ is activated in response to the decode signal from row decoder 120A to make conductive MOSFETs Mm connected thereto. Thus, a divided voltage appearing at a common terminal Zm corresponding to the activated line and row lead wires, as previously described, is applied by the corresponding MOSFET Mm through the conductive switch element Sm to the comparator 80.

Then one of the received second decode signals Sd from output decoder, the row decoder 120A decodes a value of one of the second decode signals Sd, as previously described, to generate a decode signal, in response to which another one of the row lead wires $X_1$-$X_{32}$ is activated to make conductive MOSFETs Mm connected thereto. At this stage, any switch element of switch circuit 130A may not be conducted by the line decoder 110A related to one of the second decode signals Sd. When the remaining received second decode signal Sd from output decoder 70, the row decoder 120B decodes a value of the remaining second decode signal Sd, as previously described, to generate a decode signal in response to which another one of the row lead wires $X_{33}$-$X_{64}$ is activated to make conductive MOSFETs Mm connected thereto. At this stage, any switch element of switch element 130B may not be conducted by the line decoder 110B related to the remaining second decode signal Sd. In this case, rising rate in each of divided voltages appearing respectively at common terminals of the resistors $R_1$-$R_{2048}$ and line and row lead wires $Y_{1A}$-$Y_{32A}$, $Y_{1B}$-$Y_{32B}$ and $Y_1$-$Y_{32}$.

Figure 6:
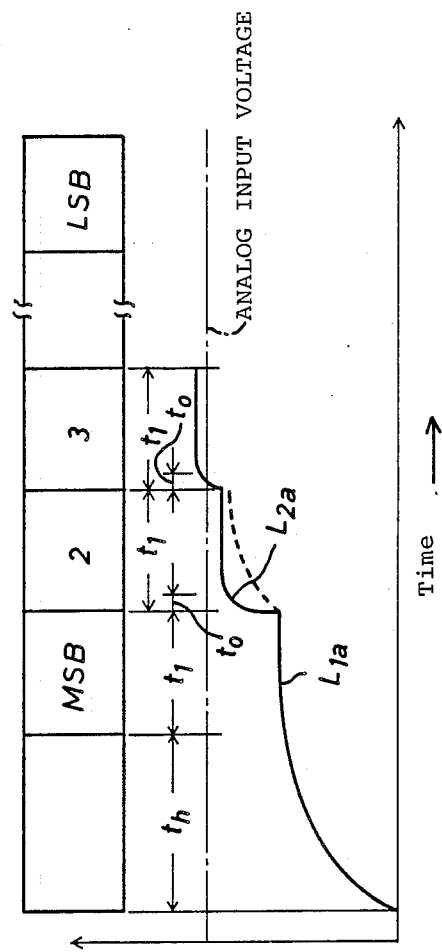
FIG. 6 is a graph for explaining operation of the modified divided voltage generator.

Upon lapse of the time duration $t_n$ after start of the A-D converter, each of the preset counter 50 and enable pulse generator 60 starts to count the number of clock pulses from clock generator 20. When latch and selection signals Sa and Sb appears from preset counter 50, the data latch output circuit 90 is responsive to the latch signal Sa to latch a comparison signal appearing from comparator 80 at this stage. In this instance, the divided voltage which is applied to the comparator 80 from switch circuit 130A fully rises, as shown by a solid line $L_{1a}$ in FIG. 6, with lapse of the time duration $(t_n+t_1)$ after start of the A-D converter. This means that comparing operation of comparator 80 is performed precisely in stability on a basis of the divided voltage from switch circuit 130A.

When the sample hold voltage from sample hold circuit 40 is higher than the divided voltage from switch circuit 130A, the output decoder 70 produces again one of the second decode signals Sd in response to which the line decoder 110A activates another one of the line lead wires $Y_{1A}$-$Y_{32A}$. Then, a divided voltage or (3 $V_{ref}/4$) appearing at the common terminal Zm defined by respective another ones of the row and line lead wires $X_1$-$X_{32}$ and $Y_{1A}$-$Y_{32A}$, as previously described in applied by the conducted corresponding MOSFET Mm through the switch circuit 130A to comparator 80. In this case, the divided voltage, which is applied to comparator 80, as previously described, rapidly, rises up to (3 $V_{ref}/4$), as shown by a solid line $L_{2a}$ in FIG. 6, because of the above-mentioned operation of the string resistor circuit 150 responsive to a first enable pulse issued from enable pulse generator 60. The rising rate of the divided voltage is further facilitated by decrease of the floating capacity in the string resistor circuit 140A. This means that comparing operation of comparator 80 is precisely performed on a basis of the divided voltage which has been conditioned rapidly in stability. When the sample and hold voltage from sample hold circuit 40 is lower than the divided voltage (3 $V_{ref}/4$) from switch circuit 130A, the output decoder 70 produces again a second decode signal Sd in response to which the line decoder 110B activates another one of the line lead wires $Y_{1B}$-$Y_{32B}$ by way of the switch circuit 130B. Then, a divided voltage or ($V_{ref}/4$) appearing at the common terminal $Z_m$, which is defined by respective another ones of the row lead wires $X_{33}$-$X_{64}$ and $Y_{1B}$-$Y_{32B}$, as previously described, is applied by the conducted corresponding MOSFET $M_m$ in the string resistor circuit 140B through the switch circuit 130B to the comparator 80. In this case, comparing operation of comparator 80 is precisely performed on a basis of the divided voltage which has been conditioned rapidly in stability in the same manner as that as previously described. In addition, A-D conversion regarding the remaining bits is performed in the substantially same manner as that as previously described.

From the above description, it should be understood that because initial selections of divided voltages corresponding to MSB and the bit next to MSB are simultaneously realized upon start of A-D conversion, the divided voltage corresponding to MSB may enoughly rise up to ($V_{ref}/2$) within ($t_n+t_1$) and the divided voltage corresponding to the bit next to MSB may enoughly rise up to (3 $V_{ref}/4$) or ($V_{ref}/4$) within ($t_n+2t_1$). This means that A-D conversion regarding MSB and the bit next to MSB may be effected precisely in stability. Furthermore, this effect may be facilitated by the subsidiary string resistor circuit 140. In addition, the settling time may become short owing to decrease of floating capacity caused by decrease in length of the line lead wires and the number of MOSFETs in each of string resistor circuits 140A, 140B.

For the actual practices of the present invention, the number of division of the main string circuit may be changed in necessity.

Having now fully set forth the preferred embodiments and certain modifications of the concept underlying the present invention, various other embodiments as well as certain variations and modifications of the embodiment herein shown and described will obviously occur to those skilled in the art upon becoming familiar with said underlying concept. It is to be understood, therefore, that within the scope of the appended claims, the invention may be practiced otherwise than as specifically set forth herein.

What is claimed is:

1. An analog-to-digital converter of the successive-approximation type for converting an analog level into a digital value, comprising:
   a reference voltage source for generating a reference voltage;
   a string of high resistance elements, connected to said reference voltage source, forming a series of voltage dividers for dividing the reference voltage into a series of divided voltages;

successive-approximation logic circuit means for successively generating selection signals based on a current digital value;

switch matrix circuit means coupled to said high resistance elements, for actuating to produce one divided voltage therefrom, when activated in response to an appropriate selection signal from said successive-approximation logic circuit means;

comparison means for successively comparing the analog level to be converted with said one divided voltage from said switch matrix circuit means, and for generating a comparison signal indicative of said comparing and indicative of a bit in said digital value;

output means coupled to said comparison means, for generating said current digital value as defined by the comparison signals from said comparison means, said output means being associated with said successive-approximation logic circuit means and providing said current digital value thereto;

a string of low resistance elements, of a lower resistance than a resistance of said high resistance elements, connected in parallel with a group of said high resistance elements; and application means for operating during a short period of time immediately after said actuating of said switch matrix circuit means, to apply the reference voltage through at least one of said low resistance elements to at least one of said voltage dividers for said short period.

2. An analog-to-digital converter as claimed in claim 1, wherein said application means includes:

switch means for activating in response to one of the selection signals applied thereto from said successive-approximation logic means; and means, interposed between a first common terminal of a pair of said low resistance elements and a second common terminal of a pair of said low resistance elements and a second common terminal of a pair of said high resistance elements, to apply therethrough the reference voltage to the second common terminal in response to activation of said switch matrix circuit means.

3. An analog-to-digital converter as claimed in claim 2, wherein said application means further comprises means for producing a control signal therefrom in response to one of the selection signals from said successive-approximation logic circuit means, and wherein said switch matrix circuit means is arranged to be activated in response to the control signal.

4. An analog-to-digital converter as claimed in claim 3, wherein said switch matrix circuit means is in the form of a first field-effect transistor which is arranged to be activated in response to the control signal; and wherein said means interposed between the first and second common terminals is in the form of a second field-effect transistor for applying the reference voltage from the first common terminal therethrough to the second common terminal when activated in response to the control signal under activation of said first field-effect transistor.

5. An analog-to-digital convertor of the successive-approximation type for converting an analog level into a digital value, comprising:

a reference voltage source for generating a reference voltage;

a string of high resistance elements, connected to said reference voltage source, for dividing the reference voltage into a series of divided voltages;

first means, connected to receive said series of divided voltages, for successively selecting a selected divided voltage from said series of divided voltages based on a current plurality of significant bits in said digital value;

second means for generating therethrough the selected divided voltage each time when activated in response to a selection of said first means;

third means for successively comparing the analog level to be converted with the selected divided voltage applied thereto from said second means, and for generating a comparison signal indicative of each comparison, each said comparison signal respectively indicative of bits in said digital value in order of significance;

fourth means for generating said digital value as said current plurality of significant bits defined by said comparison signals from said third means, said fourth means being associated with said first means to provide said current plurality of significant bits to said first means to permit the selection of the divided voltages; and fifth means cooperable with a series of said high resistance elements, for rapidly adjusting the selected divided voltage toward an optimum level in response to a selection of said first means, during a short period of time following said selection, and for more slowly changing the changed divided voltages toward the optimum levels after lapse of the short period of time.

6. A successive approximation analog to digital converter, comprising:

successive approximation means, coupled to receive an analog voltage to be converted and a produced analog voltage corresponding to a digital signal, for successively improving a number of bits of significance of said digital signal at each cycle of operation, based on a difference between said analog voltage to be converted and said produced analog voltage; and divided voltage generating means, receiving said digital signal, for producing said produced analog voltage, said generating means including first means for causing said produced analog voltage to rapidly approach a voltage corresponding to said digital signal for a first time period beginning at a beginning of at least one of said cycles of operation, and second means for causing said produced analog voltage to more slowly approach said voltage corresponding to the digital signal for a second time period following said first time period.

7. A converter as in claim 6 wherein said first means includes a first resistive ladder network, formed of high resistance resistors, and said second means includes a second resistive ladder network, formed of low resistance resistors.

8. A converter as in claim 7 further comprising a plurality of switching elements for selectively actuating to receive an output voltage from one of said resistive ladders.

9. A converter as in claim 8 further comprising row and column decoders for actuating said switching elements.

10. A converter as in claim 6 wherein said first means comprises a voltage divider, and said successive-approximation means comprises:
  successive-approximation logic circuit means for successively generating selection signals based on said digital signal;
  switch matrix circuit means, coupled with said first means, for actuating to produce a divided voltage therefrom, when actuated in response to an appropriate selection signal from said successive-approximation logic circuit means; and
  comparison means for successively comparing the analog voltage to be converted with a current divided voltage from said switch matrix circuit means, and for generating a comparison signal indicative of significant bits in said digital signal.

11. A converter as in claim 6 wherein said first time period is short as compared with said second time period.

12. The converter as in claim 11 wherein said second means is actuated only for some of said cycles of operation.

13. A successive approximation analog to digital converter, comprising:
  successive approximation means, coupled to receive an analog voltage to be converted and a produced analog voltage corresponding to a digital approximation signal, for successively producing said digital approximation signal with more accuracy during each of a plurality of cycles of operation, based on a difference between said analog voltage to be converted and said produced analog voltage;
  divided voltage generating means, receiving said digital approximation signal and a voltage reference, for producing said produced analog voltage, said generating means including first resistive divider means, including a resistor ladder assembly of high resistance resistors, for dividing said voltage reference using said high resistance resistors to produce a voltage which slowly approached an optimum voltage, and second means, including a resistor ladder assembly of low resistance resistors in parallel with said resistor ladder assembly of high resistance resistors, for dividing said voltage reference using said low resistance resistors to produce a voltage which more rapidly approached said optimum voltage; and
  timing means for commanding said second means to operate only for a short time period after a beginning of at least one of said cycles and for commanding said first means to operate at other times.

14. A method of analog to digital conversion using successive approximation, comprising the steps of:
  estimating a digital equivalent of an analog signal to be converted and producing a digital approximation signal indicative thereof;
  converting said digital equivalent to a produced analog voltage, by first causing said produced analog voltage to rapidly approach a voltage corresponding to said digital approximation signal for a first time period;
  next causing said produced analog voltage to more slowly approach said voltage for a second time period following said first time period;
  receiving said analog voltage to be converted and said produced analog voltage and determining a difference therebetween; and
  improving a number of bits of significance of said digital approximation signal based on said difference between said analog voltage to be converted and said produced analog voltage.

* * * * *